United States Patent
Oh et al.

(10) Patent No.: US 10,475,782 B2
(45) Date of Patent: Nov. 12, 2019

(54) ESD PROTECTION DIODE AND ELECTRONIC DEVICE INCLUDING THE SAME

(71) Applicants: Electronics and Telecommunications Research Institute, Daejeon (KR); Industry-Academic Cooperation Foundation, Dankook University, Yongin-si, Gyeonggi-do (KR)

(72) Inventors: Jimin Oh, Daejeon (KR); Yong-Seo Koo, Seoul (KR); Yil Suk Yang, Daejeon (KR); Jongdae Kim, Daejeon (KR)

(73) Assignees: ELECTRONICS AND TELECOMMUNICATIONS RESEARCH INSTITUTE, Daejeon (KR); INDUSTRY-ACADEMIC COOPERATION FOUNDATION, DANKOOK UNIVERSITY, Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/713,121

(22) Filed: Sep. 22, 2017

(65) Prior Publication Data

US 2018/0096986 A1     Apr. 5, 2018

(30) Foreign Application Priority Data

Sep. 30, 2016    (KR) ........................ 10-2016-0126995

(51) Int. Cl.
    *H01L 27/02*       (2006.01)
    *H01L 29/74*       (2006.01)
    *H01L 29/87*       (2006.01)

(52) U.S. Cl.
CPC ...... *H01L 27/0266* (2013.01); *H01L 27/0262* (2013.01); *H01L 29/7412* (2013.01); *H01L 29/87* (2013.01)

(58) Field of Classification Search
CPC ............. H01L 27/0266; H01L 27/0262; H01L 29/7412
See application file for complete search history.

(56) References Cited

U.S. PATENT DOCUMENTS 6,784,029 B1    8/2004   Vashchenko et al.
7,342,281 B2    3/2008   Kim et al.
(Continued)

FOREIGN PATENT DOCUMENTS

KR     10-0627134 B1    9/2006
KR     10-0877154 B1    1/2009

OTHER PUBLICATIONS

Gong et al., "ESD-Induced Circuit Performance Degradation in RFICs", Microelectronics Reliability, 71(9-10), Sep. 2001.
(Continued)

*Primary Examiner* — Wael M Fahmy
*Assistant Examiner* — Sarah K Salerno
(74) *Attorney, Agent, or Firm* — Rabin & Berdo, P.C.

(57) ABSTRACT

Provided are an ESD protection diode and an electronic device including the same. An ESD protection diode and an electronic device including the same according to an embodiment of the inventive concept include first to fifth wells. The first well is connected to a first voltage terminal. The second well is connected to a second voltage terminal. The third well is connected to the input/output terminal. The fourth well is disposed between the first well and the third well, and the fifth well is disposed between the second well and the third well. The first to third wells are N-type wells, and the fourth and fifth wells are P-type wells. The first well
(Continued)

includes a first N+ diffusion region and the second well includes a second N+ diffusion region. The fourth well includes a first P+ diffusion region and the fifth well includes a second P+ diffusion region. According to an embodiment of the inventive concept, an internal circuit is protected fro an ESD pulse applied to a plurality of terminals and holding voltage is increased.

12 Claims, 6 Drawing Sheets

(56) References Cited

U.S. PATENT DOCUMENTS

2007/0131965 A1   6/2007   Kim et al.
2014/0167105 A1*  6/2014   Salcedo .............. H01L 27/0262
                                                            257/140

OTHER PUBLICATIONS

Song et al., "The Design of SCR-based Whole-Chip ESD Protection with Dual-Direction and High Holding Voltage", Journal of IKEEE. vol. 17, No. 3, p. 378-384, Sep. 2013.

* cited by examiner

ESD PROTECTION DIODE AND ELECTRONIC DEVICE INCLUDING THE SAME

CROSS-REFERENCE TO RELATED APPLICATIONS

This U.S. non-provisional patent application claims priority under 35 U.S.C. § 119 of Korean Patent Application No. 10-2016-0126995, filed on Sep. 30, 2016, the entire contents of which are hereby incorporated by reference.

BACKGROUND

The present disclosure herein relates to Electrostatic Discharge (ESD), and more particularly, to an ESD protection diode and an electronic device including the same.

An internal circuit of an electronic device may be damaged by static electricity generated during a manufacturing process or during use, and a protection diode for such Electrostatic Discharge (ESD) is required.

Especially, an ESD protection diode using a Silicon Controller Rectifier (SCR), which is easily miniaturized with a highly robust characteristic and minimizes a parasite capacitance component, is being developed. An ESD protection diode using a typical SCR operates in an off state until it reaches a trigger point, and forms a discharge path when it reaches the trigger point as an ESD pulse is applied. In such a case, a pad voltage maintains a holding voltage, and when the pad voltage becomes lower than the holding voltage, the ESD protection diode operates in an off state.

Such an ESD protection diode discharges static electricity only for an ESD pulse flowing in a specific direction. Therefore, there is a continuing need for an ESD protection diode with a plurality of discharge paths. In addition, there is a continuing need to adjust the trigger voltage or holding voltage of an ESD protection diode to match the characteristics of each electronic device.

SUMMARY

The present disclosure provides an ESD protection diode having a plurality of discharge paths and increasing a holding voltage and an electronic device including the same.

An embodiment of the inventive concept provides an ESD protection diode including a base substrate and first to fifth wells. The first to third well may be N-type wells and the fourth and fifth wells may be P-type wells The first well may be disposed on the base substrate and connected to a first voltage terminal. The second well may be disposed on the base substrate and connected to a second voltage terminal. The third well may be disposed on the base substrate and connected to an input/output terminal.

The fourth well may be disposed between the first well and the third well. The fifth well may be disposed between the second well and the third well.

The first well may further include a third N+ diffusion region and a third P+ diffusion region which are formed to be connected to the first voltage terminal. The second well may further include a fourth N+ diffusion region and a fourth 4 P+ diffusion region, which are formed to be connected to the second voltage terminal. The third well includes a fifth N+ diffusion region, a fifth P+ diffusion region, and a sixth P+ diffusion region, which are formed to be connected to the input/output terminal. The fifth N+ diffusion region may be formed between the fifth P+ diffusion region and the sixth P+ diffusion region.

The ESD protection diode may further include first to fourth diffusion regions. The first diffusion region may be formed in a junction region of the first well and the fourth well. The second diffusion region may be formed in a junction region of the second well and the fifth well. The third diffusion region may be formed in a junction region of the third well and the fourth well. The fourth diffusion region may be formed in a junction region of the third well and the fifth well.

The third P+ diffusion region, the first well, and the fourth well may form a first transistor. The first well, the fourth well, and the third well may form a second transistor. The fifth P+ diffusion region, the third well, and the fourth well may form a third transistor. The sixth P+ diffusion region, the third well, and the fifth well may form a fourth transistor. The third well, the fifth well, and the second well may form a fifth transistor. The fourth P+ diffusion region, the second well, and the fifth well may form a sixth transistor. The first transistor, the third transistor, the fourth transistor, and the sixth transistor may be PNP bipolar transistors. The second transistor and the fifth transistor may be NPN bipolar transistors.

When a voltage level of the first voltage terminal is higher than a voltage level of the input/output terminal by more than a first reference value, the first transistor and the second transistor may be turned on. When the voltage level of the input/output terminal is higher than the voltage level of the first voltage terminal by more than a second reference value, the second transistor and the third transistor may be turned on. When the voltage level of the input/output terminal is higher than a voltage level of the second voltage terminal by more than a third reference value, the fourth transistor and the fifth transistor may be turned on. When the voltage level of the second voltage terminal is higher than the voltage level of the input/output terminal by more than a fourth reference value, the second transistor and the third transistor may be turned on.

In an embodiment of the inventive concept, an electronic device includes a first voltage terminal, an input/output terminal, and a second voltage terminal. The first voltage terminal is configured to receive a power supply voltage. The input/output terminal is configured to receive an input voltage. The second voltage terminal is grounded.

The ESD protection diode forms a first discharge path from the first voltage terminal to the input/output terminal when a voltage level of the first voltage terminal is higher than a voltage level of the input/output terminal by more than a first reference value. The ESD protection diode forms a second discharge path from the input/output terminal to the first voltage terminal when the voltage level of the input/output terminal is higher than the voltage level of the first voltage terminal by more than a second reference value. The ESD protection diode forms a third discharge path from the input/output terminal to the second voltage terminal when the voltage level of the input/output terminal is higher a voltage level of the second voltage terminal by more than a third reference value. The ESD protection diode forms a fourth discharge path from the second voltage terminal to the input/output terminal when the voltage level of the second voltage terminal is higher than the voltage level of the input/output terminal by more than a fourth reference value.

The ESD protection diode may include a first transistor having one end connected to the first voltage terminal, a second transistor having one end connected to the first voltage terminal and the other end connected to the input/output terminal, a third transistor having one end connected to the input/output terminal, a fourth transistor having one end connected to the input/output terminal, a fifth transistor having one end connected to the input/output terminal and the other end connected to the second voltage terminal, and a sixth transistor having one end connected to the second voltage terminal. A control terminal of the second transistor may be connected to the other end of the first transistor and the other end of the third transistor. A control terminal of the fifth transistor may be connected to the other end of the fourth transistor and the other end of the sixth transistor.

The first discharge path may be formed as the first and second transistors are turned on. The second discharge path may be formed as the second and third transistors are turned on. The third discharge path may be formed as the fourth and fifth transistors are turned on. The fourth discharge path may be formed as the fifth and sixth transistors are turned on.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the present invention.

Figure 1:
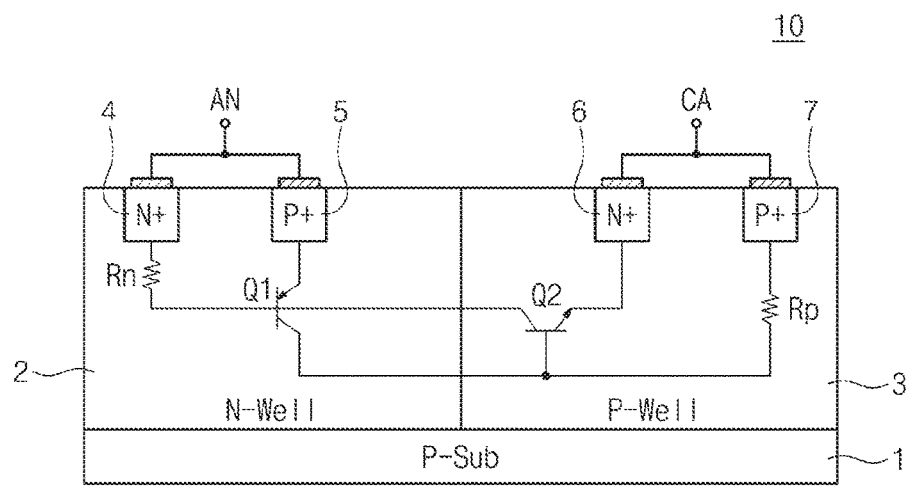
FIGS. 1 and 2 are cross-sectional views of an ESD protection diode using a semiconductor controlled rectifier.
Figure 2:
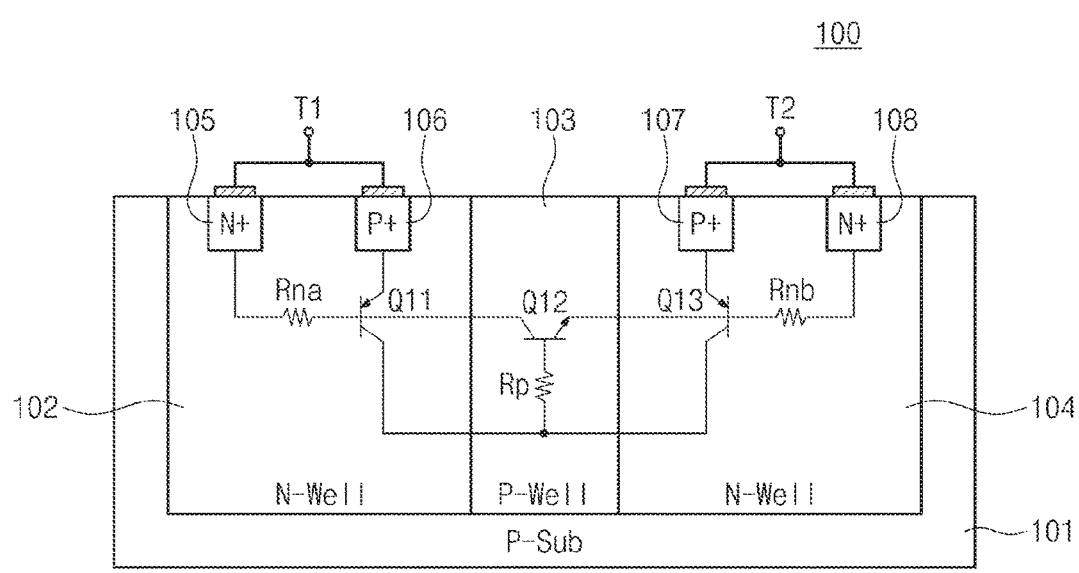

FIGS. 1 and 2 are cross-sectional views of an ESD protection diode using a semiconductor controlled rectifier (SCR).

Referring to FIG. 1, an ESD protection diode 10 includes an N-type well 2 and a P-type well 3. The N-type well 2 forms an N+ diffusion region 4 and a P+ diffusion region 5, which are used as an anode and the P-type well 3 forms an N+ diffusion region 6 and a P+ diffusion region 7, which are used as a cathode.

Referring to FIG. 1, the ESD protection diode 10 includes a PNP bipolar transistor Q1, an NPN bipolar transistor Q2, an N-type well resistor Rn, and a P-type well resistor Rp. The PNP bipolar transistor Q1 is formed of the first P+ diffusion region 5, the N-type well 2, and the P-type well 3, and the NPN bipolar transistor Q2 is formed of the N-type well 2, the P-type well 3, and the second N+ diffusion region 6. The N-type well resistor Rn is connected to the base of the PNP bipolar transistor Q1. Since the distance by which current reaches the P-type well 3 through the first N+ diffusion region 4 is longer than the distance by which current reaches the P-type well 3 through the first P+ diffusion region 5, a resistance value according to the difference thereof may be represented as the N-type well resistor Rn. The P-type well resistor Rp is connected to the base of the NPN bipolar transistor Q2. Since the distance by which electron reaches the N-type well 2 through the second P+ diffusion region 7 is longer than the distance by which electron reaches the N-type well 2 through the first N+ diffusion region 6, a resistance value according to the difference thereof may be represented as the P-type well resistor Rp.

The emitter-base junction of the PNP bipolar transistor Q1 becomes a forward bias state by the ESD pulse flowing into the anode terminal AN and the N-type well resistor Rn. Also, the PNP bipolar transistor Q1 is turned on. In this case, a current flows from the N-type well 2 to the P-type well 3, and the NPN bipolar transistor Q2 is turned on. The ESD protection diode 10 is triggered by the turned-on PNP bipolar transistor Q1 and NPN bipolar transistor Q2. It is required that the Avalanche Breakdown appears at the junction of the N-type well 2 and the P-type well 3 in order for the ESD protection diode 10 to perform a trigger operation.

Referring to FIG. 2, an ESD protection device 100 includes a base substrate 101, a first N-type well 102, a P-type well 103, and a second N-type well 104. The first N-type well 102 includes a first N+ diffusion region 105 and a first P+ diffusion region 106 formed to be connected to a first terminal T1. The second N-type well 104 includes a second N+ diffusion region 107 and a second P+ diffusion region 108 formed to be connected to a second terminal T2. The P-type well 103 is disposed between the first N-type well 102 and the second N-type well 104.

The first P+ diffusion region 106, the first N-type well 102, and the P-type well 103 form a first PNP bipolar transistor Q11. The first N-type well 102, the P-type well 103, and the second N-type well 104 form an NPN bipolar transistor Q12. The second P+ diffusion region 107, the second N-type well 104, and the P-type well 103 form a second PNP bipolar transistor Q13. The first N-type well 102 and the second N-type well 104 form N-type well resistors Rna and Rnb, respectively. The P-type well 103 forms a P-type well resistor Rp.

When a positive ESD pulse is applied to the first terminal T1 (or a negative ESD pulse is applied to the second terminal T2), a reverse bias is formed between the first N-type well 102 and the P-type well 103, and when an electric field exceeds a reference value, avalanche breakdown occurs. In this case, the first PNP bipolar transistor Q11 and the NPN bipolar transistor Q12 are turned on and an ESD pulse forms a discharge path to the second terminal T2 through the second N-type well 104 and the second N+ diffusion region 108.

When a positive ESD pulse is applied to the second terminal T2 (or a negative ESD pulse is applied to the first terminal T1), a reverse bias is formed between the second N-type well 104 and the P-type well 103, and when an electric field exceeds a reference value, avalanche breakdown occurs. In this case, the second PNP bipolar transistor Q13 and the NPN bipolar transistor Q12 are turned on and an ESD pulse forms a discharge path to the first terminal T1 through the first N-type well 102 and the first N+ diffusion region 105.

Unlike FIG. 1, the ESD protection diode 100 of FIG. 2 may form a discharge path for both the ESD pulse applied to the first terminal T1 and the ESD pulse applied to the second terminal T2.

Figure 3:
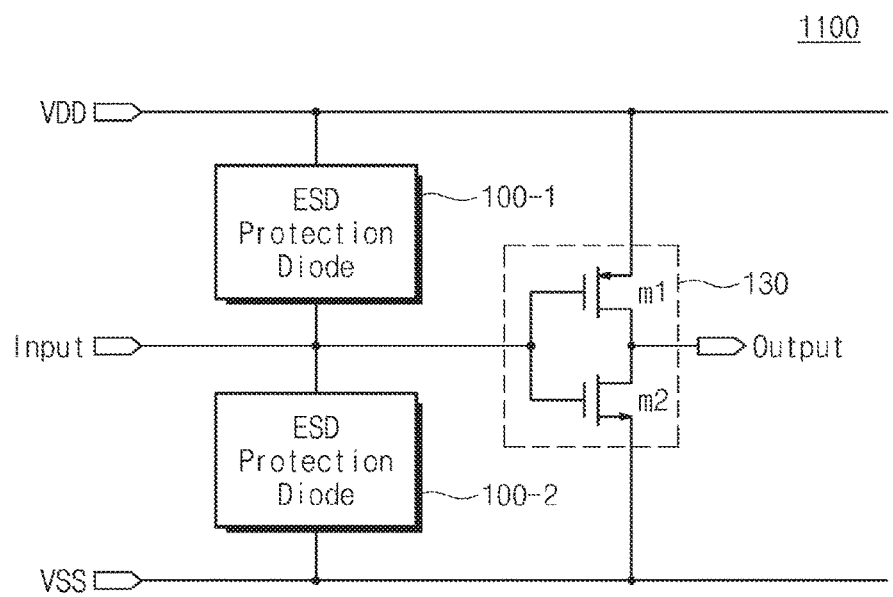
FIG. 3 is a block diagram illustrating an electronic device including the ESD protection diode of FIG. 2.
Figure 4:
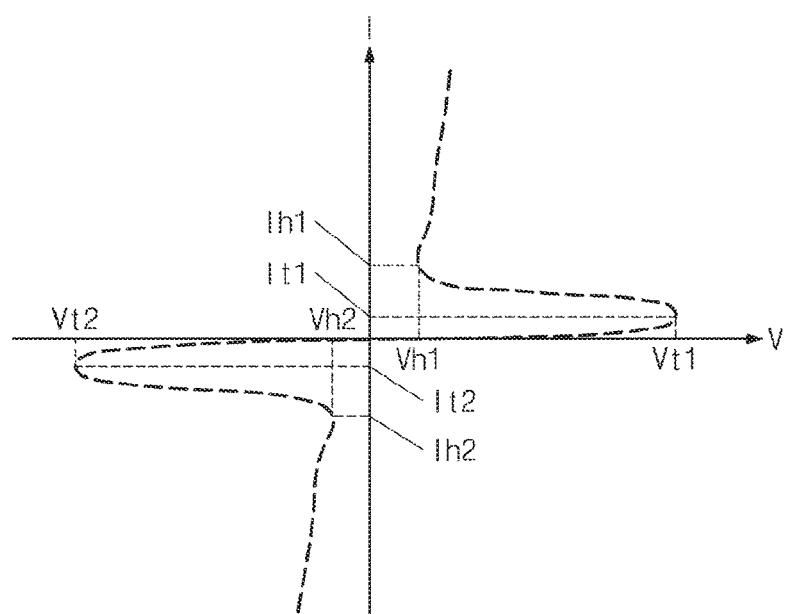
FIG. 4 is a graph illustrating the V-I characteristics of the ESD protection diode of FIG. 2.

FIG. 3 is a block diagram illustrating an electronic device including the ESD protection diode of FIG. 2. FIG. 4 is a graph illustrating the V-I characteristics of the ESD protection diode of FIG. 2.

Referring to FIG. 3, the electronic device 1100 includes first and second ESD protection diodes 100-1 and 100-2 and an inverter unit 130.

One end of the first ESD protection diode 100-1 receives a first voltage VDD and the other end receives an input voltage. One end of the second ESD protection diode 100-2 receives a second voltage VSS and the other end receives an input voltage. The first voltage VDD may be the power supply voltage of the electronic device 1100. The second voltage VSS may be a ground voltage. The first ESD protection diode 100-1 provides a discharge path for a positive ESD pulse or a negative ESD pulse flowing from one end that receives the first voltage VDD. The second ESD protection diode 100-2 provides a discharge path for a positive ESD pulse or a negative ESD pulse flowing from one end that receives the second voltage VSS.

The ESD protection diode 100 of FIG. 2 provides a discharge path for an ESD pulse entering the first terminal T1 or the second terminal T2. Accordingly, the electronic device 1100 requires at least two ESD protection diodes 100-1 and 100-2 to protect the inverter unit 130 and an internal circuit (not shown) from positive or negative ESD pulses flowing into the terminal of the first voltage VDD and positive or negative ESD pulses flowing into the terminal of the second voltage VSS.

The inverter unit 130 may include a PMOS M1 and an NMOS M2. The inverter unit 130 may output the second voltage VSS when the input voltage is in a high level and may output the first voltage VDD when the input voltage is in a low level. That is, the inverter unit 130 may deliver power supply voltage to an internal circuit (not shown) when the input voltage is in a low level. However, the inventive concept is not limited thereto, and when the input voltage is in a high level as the PMOS M1 is connected to the second voltage VSS, and the NMOS M2 is connected to the first voltage VDD, the power supply voltage may be delivered to an internal circuit (not shown). In addition, the inverter unit 130 may serve as a buffer for delaying the timing of a voltage supplied to an internal circuit (not shown) based on the input voltage.

The PMOS M1 and the NMOS M2 include a thin metal oxide layer. Since this is easily broken by static electricity, the damage of the inverter unit 130 may be prevented by using the ESD protection diode 100.

Referring to FIG. 4, a potential difference between the first terminal T1 and the second terminal T2 of the ESD protection diode 100 of FIG. 2 is defined as a horizontal axis, and a current flowing between the first terminal T1 and the second terminal T2 of the ESD protection diode 100 is defined as a vertical axis.

In relation to the positive ESD pulse, when a potential difference between the first terminal T1 and the second terminal T2 is smaller than a first trigger voltage Vt1 or a current flowing between the first terminal T1 and the second terminal T2 is smaller than a first trigger current It1, the ESD protection diode 100 has a large impedance. That is, the ESD protection diode 100 operates in an off state.

When a current or voltage applied to the ESD protection diode 100 becomes equal to or greater than the first trigger point Vt1 or It1 by a positive ESD pulse, the characteristics of the ESD protection diode 100 are changed along a curve to first holding point Vh1 or Ih1. In this case, a discharge path is formed between the first terminal T1 and the second terminal T2, and a current applied to the first terminal T1 flows to the second terminal T2. Also, a potential difference between the first terminal T1 and the second terminal T2 may be maintained so as not to deviate greatly from the first holding voltage Vh1. Then, when an ESD current becomes smaller than the first holding current Ih1, the ESD protection diode 100 operates in an off state.

The ESD protection diode 100 in a negative ESD pulse has similar characteristics to the ESD protection diode 100 in a positive ESD pulse. That is, when a potential difference between the first terminal T1 and the second terminal T2 is greater than a second trigger voltage Vt2 or a current flowing between the first terminal T1 and the second terminal T2 is greater than a second trigger current It2, the ESD protection diode 100 operates in an off state. Furthermore, when a current or voltage applied to the ESD protection diode 100 becomes less than the second trigger point Vt2 or It2 by a negative ESD pulse, the characteristics of the ESD protection diode 100 are changed along a curve to second holding point Vh2 or Ih2 and a discharge path in a direction opposite to a discharge path by a positive ESD pulse is formed. Then, when an ESD current becomes greater than the second holding current Ih2, the ESD protection diode 100 operates in an off state.

The first trigger point Vt1 or It1 and the second trigger point Vt2 or It2 may be regarded as a reference value at which the ESD protection diode 100 starts to form a discharge path. That is, at the first trigger point Vt1 or It1, the first PNP bipolar transistor Q11 and the NPN bipolar transistor Q12 of the ESD protection diode 100 may be turned on. At the second trigger point Vt2 or It2, the second PNP bipolar transistor Q13 and the NPN bipolar transistor Q12 of the ESD protection diode 100 may be turned on.

If the value of the first trigger point Vt1 or It1 is too large or the value of the second trigger point Vt2 or It2 is too small, even when an ESD pulse having a sufficient voltage or current value to damage an internal circuit is applied, the ESD protection diode 100 may not operate. Therefore, in order to achieve the object of preventing an electronic device from being damaged by static electricity, the absolute value of a trigger point may be within a predetermined area.

The first holding point Vh1 or Ih1 and the second holding point Vh2 or Ih2 may be regarded as a reference value at which the ESD protection diode 100 that forms a discharge path starts to operate in an off state. That is, at the first holding point Vh1 or Ih1, the first PNP bipolar transistor Q11 and the NPN bipolar transistor Q12 of the ESD protection diode 100 may be turned off. At the second holding point Vh2 or Ih2, the second PNP bipolar transistor Q13 and the NPN bipolar transistor Q12 of the ESD protection diode 100 may be turned off.

If the value of the first holding point Vh1 or Ih1 is too small or the value of the second holding point Vh2 or Ih2 is too large, a discharge path is formed in the ESD protection diode 100 even after the ESD pulse disappears, so that the input voltage may not provided to an internal circuit. Therefore, the absolute value of the holding point may be increased for application in an electronic device requiring high voltage.

Figure 5:
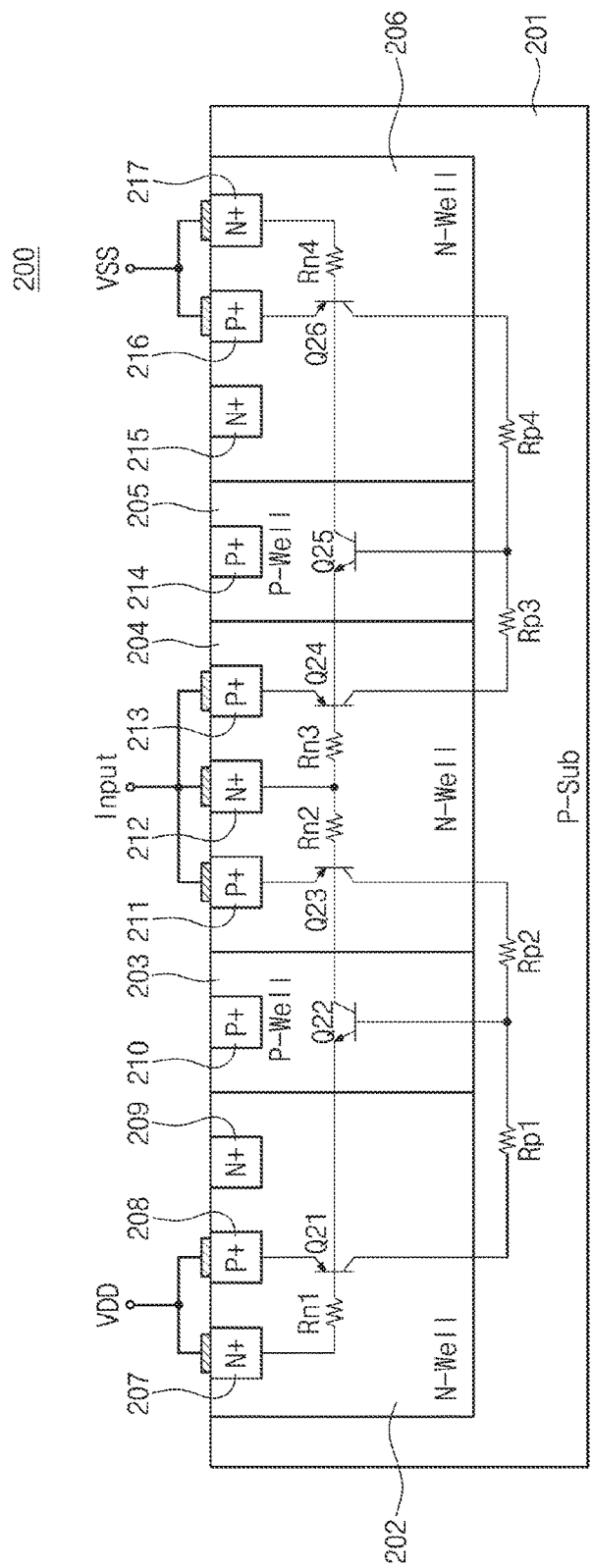
FIG. 5 is a cross-sectional view of an ESD protection diode according to an embodiment of the inventive concept.

FIG. 5 is a cross-sectional view of an ESD protection diode according to an embodiment of the inventive concept. According to an embodiment of the inventive concept, provided may be an ESD protection diode 200 that forms a discharge path for all cases, for example, when a positive ESD pulse is provided to the terminal of the first voltage VDD, when a negative ESD pulse is provided to the terminal of the first voltage VDD, when a positive ESD pulse is provided to the terminal of the second voltage VSS, and when a negative ESD pulse is provided to the terminal of the second voltage VSS. Hereinafter, when a positive ESD pulse is provided to the terminal of the first voltage VDD, this is defined as operating in a first mode. When a negative ESD pulse is provided to the terminal of the first voltage VDD, this is defined as operating in a second mode. When a positive ESD pulse is provided to the terminal of the second voltage VSS, this is defined as operating in a third mode. When a negative ESD pulse is provided to the terminal of the second voltage VSS, this is defined as operating in a fourth mode.

Referring to FIG. 5, an ESD protection device 200 includes a base substrate 201, a first well 202, a second well 206, a third well 204, a fourth well 203, and a fifth well 205. The base substrate 201 may be a P-type substrate. The first well 202, the second well 206, and the third well 204 may be an N-type well. The fourth well 203 and the fifth well 205 may be a P-type well.

The first well 202 is disposed on the base substrate 201 and is connected to the terminal of the first voltage VDD. The second well 206 is disposed on the base substrate 201 and is connected to the terminal of the second voltage VSS. The third well 204 is disposed on the base substrate 201 and is connected to the input/output terminal. The fourth well 203 is disposed on the base substrate 201 and disposed between the first well 202 and the third well 204. The fifth well 205 is disposed on the base substrate 201 and disposed between the second well 206 and the third well 204.

The first well 202 includes a first N+ diffusion region 209 formed spaced apart from the terminal of the first voltage VDD. The second well 206 includes a second N+ diffusion region 215 formed spaced apart from the terminal of the second voltage VSS. The fourth well 203 includes a first P+ diffusion region 210 and the fifth well 205 includes a second P+ diffusion region 214. The first N+ diffusion region 209, the second N+ diffusion region 215, the first P+ diffusion region 210, and the second P+ diffusion region 214 are for increasing the absolute value of a holding voltage, and this will be described later.

The first well 202 further includes a third N+ diffusion region 207 and a third P+ diffusion region 208 formed to be connected to the terminal of the first voltage VDD. The second well 206 further includes a fourth N+ diffusion region 216 and a fourth P+ diffusion region 217 formed to be connected to the terminal of the second voltage VSS. The third well 204 further includes a fifth P+ diffusion region 211, a fifth N+ diffusion region 212, and a sixth P+ diffusion region 213 formed to be connected to the input/output terminal. The third P+ diffusion region 208 is formed between the first N+ diffusion region 209 and the third N+ diffusion region 207 and the fourth P+ diffusion region 216 is formed between the second N+ diffusion region 215 and the fourth P+ diffusion region 217. The fifth N+ diffusion region 212 may be formed between the fifth P+ diffusion region 211 and the sixth P+ diffusion region 213.

The first P+ diffusion region 208, the first well 202, and the fourth well 203 form a first transistor Q21. The first transistor Q21 is a PNP bipolar transistor. The first well 202, the fourth well 203, and the third well 204 form a second transistor Q22. The second transistor Q22 is an NPN bipolar transistor. The fourth well 203, the third well 204, and the fifth P+ diffusion region 211 form a third transistor Q23. The third transistor Q23 is a PNP bipolar transistor. The fifth well 205, the third well 204, and the sixth P+ diffusion region 213 form a fourth transistor Q24. The fourth transistor Q24 is a PNP bipolar transistor. The second well 206, the fifth well 205, and the third well 204 form a fifth transistor Q25. The fifth transistor Q25 is an NPN bipolar transistor. The second P+ diffusion region 216, the second well 206, and the fifth well 205 form a sixth transistor Q26. The sixth transistor Q26 is a PNP bipolar transistor.

The first well 202 forms a first N-type well resistor Rn1 and the first N-type well resistor Rn1 provides a bias to the first transistor Q21. The fourth well 203 forms a first P-type well resistor Rp1 and a second P-type well resistor Rp2. The first P-type well resistor Rp1 or the second P-type well resistor Rp2 provides a bias to the second transistor Q22. The third well 204 forms a second N-type well resistor Rn2 and a third N-type well resistor Rn3. The second N-type well resistor Rn2 provides a bias to the third transistor Q23 and the third N-type well resistor Rn3 provides a bias to the fourth transistor Q24. The fifth well 205 forms a third P-type well resistor Rp3 and a fourth P-type well resistor Rp4. The third P-type well resistor Rp3 or the fourth P-type well resistor Rp4 provides a bias to the fifth transistor Q25. The second well 206 forms a fourth N-type well resistor Rn4 and the fourth N-type well resistor Rn4 provides a bias to the sixth transistor Q26.

The ESD protection diode 200 provides a discharge path for the first to fourth modes. For example, the first transistor Q21 and the second transistor Q22 are turned on in the first mode (when a positive ESD pulse is provided to the terminal of the first voltage VDD). The ESD protection diode 200 is triggered by the turned-on first transistor Q21 and second transistor Q22. Thereafter, there is no need to provide a bias to the first transistor Q21, and a voltage between the terminal of the first voltage VDD and the input/output terminal decreases to a holding voltage. The first transistor Q21 and the second transistor Q22 perform a positive feedback operation to form a discharge path. In the same manner, in the second mode, the second transistor Q22 and the third transistor Q23 are turned on to form a discharge path. In the third mode, the fifth transistor Q25 and the sixth transistor Q26 are turned on to form a discharge path. In the fourth mode, the fourth transistor Q24 and the fifth transistor Q25 are turned on to form a discharge path.

The ESD protection diode 200 may be symmetrical with respect to the input/output terminal. For example, the first well 202 and the second well 206 may have the same characteristics, and the fourth well 203 and the fifth well 205 may have the same characteristics.

Figure 6:
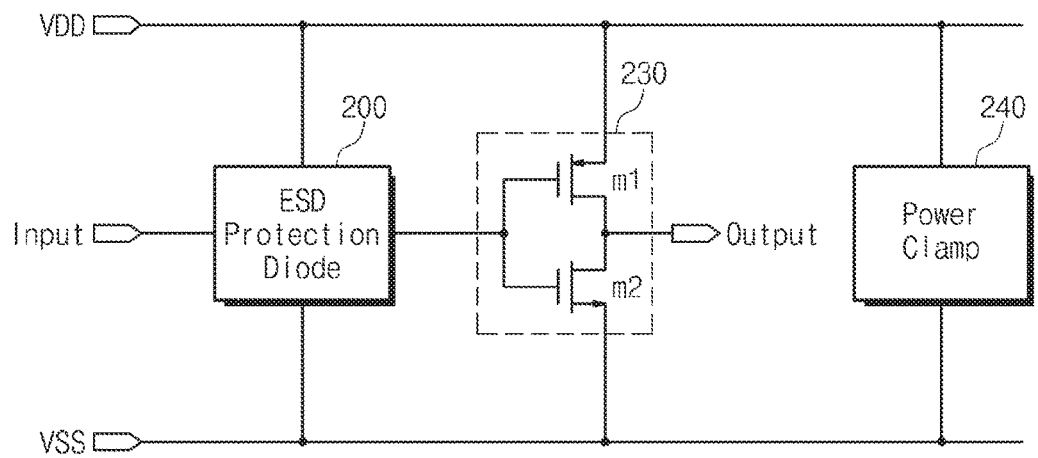
FIG. 6 is a block diagram illustrating an electronic device including the ESD protection diode of FIG. 5.
Figure 7:
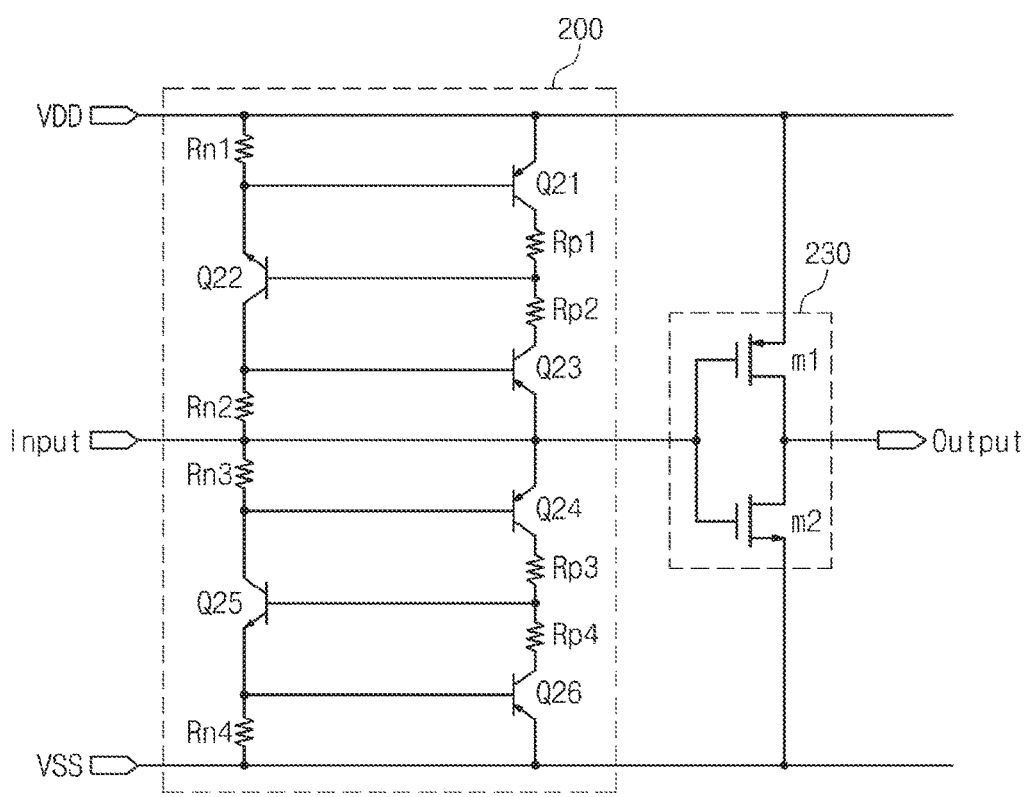
FIG. 7 is a circuit diagram illustrating an electronic device including the ESD protection diode of FIG. 5.

FIG. 6 is a block diagram illustrating an electronic device including an ESD protection diode of FIG. 5 and FIG. 7 is a circuit diagram illustrating an electronic device including an ESD protection diode of FIG. 5.

Referring to FIG. 6, an electronic device 1200 may include an ESD protection diode 200, an inverter unit 230, and a power clamp 240. The inverter unit 230 of FIG. 6 includes substantially the same configuration as the inverter unit 130 of FIG. 3 and performs the same function, so that a detailed description will be omitted. Although not shown, a voltage may be supplied to an internal circuit (not shown) through an output terminal of the inverter unit 230.

The ESD protection diode 200 is connected to the terminal of the first voltage VDD, the terminal of the second voltage VSS, and the input/output terminal. The electronic device 1200 may include one ESD protection diode 200. Compared with FIG. 3, one ESD protection diode 200 may form a discharge path in the first to fourth modes. The ESD protection diode 200 may implement functions of a first ESD protection diode 100-1 of FIG. 3, which forms a discharge path in the first and second modes and a second ESD protection diode 100-2 of FIG. 3, which forms a discharge path in the third and fourth modes by using one element. Therefore, the ESD protection diode 200 may be integrated in accordance with the one-chip configuration, and may have a cost-reducing effect. Since the area of the ESD protection diode 200 is minimized, the parasitic capacitance of each terminal may be minimized. In addition, since the ESD protection diode 200 provides a discharge path for the first to fourth modes, the stability and reliability of the electronic device 1200 may be ensured.

The power clamp 240 may be disposed between the first voltage VDD and the second voltage VSS. The power clamp 240 may provide a bypass path for ESD pulses. For example, the bypass path may be provided so that the ESD pulse introduced from the input/output terminal is transmitted to the power clamp 240 through the first voltage terminal. However, unlike FIG. 6, the electronic device 1200 may not include a separate power clamp 240.

Referring to FIG. 7, the ESD protection diode 200 includes first to sixth transistors Q21 to Q26, first to fourth N-type well resistors Rn1 to Rn4, and first to fourth P-type well resistors Rp1 to Rp4.

The emitter of the first transistor Q21 is connected to the terminal of the first voltage VDD. One end of the first N-type well resistor Rn1 is connected to the terminal of the first voltage VDD and the other end is connected to the base of the first transistor Q21. The collector (or emitter) of the second transistor Q22 is connected to the base of the first transistor Q21 and the emitter (or collector) of the second transistor Q22 is connected to the base of the third transistor Q23. One end of the first P-type well resistor Rp1 is connected to the collector of the first transistor Q21 and the other end is connected to the base of the second transistor Q22. One end of the second P-type well resistor Rp2 is connected to the collector of the third transistor Q23 and the other end is connected to the base of the second transistor Q22. The emitter of the third transistor Q23 is connected to the input/output terminal. One end of the second N-type well resistor Rn2 is connected to the input/output terminal, and the other end is connected to the base of the third transistor Q23.

The emitter of the fourth transistor Q24 is connected to the input/output terminal. One end of the third N-type well resistor Rn3 is connected to the input/output terminal, and the other end is connected to the base of the fourth transistor Q24. The collector (or emitter) of the fifth transistor Q25 is connected to the base of the fourth transistor Q24 and the emitter (or collector) of the fifth transistor Q25 is connected to the base of the sixth transistor Q26. One end of the third P-type well resistor Rp3 is connected to the collector of the fourth transistor Q24 and the other end is connected to the base of the fifth transistor Q25. One end of the fourth P-type well resistor Rp3 is connected to the collector of the sixth transistor Q26 and the other end is connected to the base of the fifth transistor Q25. The emitter of the sixth transistor Q26 is connected to the terminal of the second voltage VSS. One end of the fourth N-type well resistor Rn4 is connected to the terminal of the second voltage VSS and the other end is connected to the base of the sixth transistor Q26.

The ESD protection diode 200 may be symmetrical with respect to the input/output terminal. For example, the first transistor Q21 may have the same characteristics as the sixth transistor Q26, the second transistor Q22 may have the same characteristics as the fifth transistor Q25, and the third transistor Q23 may have the same characteristics as the fourth transistor Q24.

In the first mode, a positive ESD pulse is provided to the terminal of the first voltage VDD. When a potential value between the terminal of the first voltage VDD and the input/output terminal is equal to or higher than a reference value by a positive ESD pulse, the first transistor Q21 is turned on and the second transistor Q22 is turned on. A discharge path is formed between the terminal of the first voltage VDD and the input/output terminal by the forward feedback operation of the first transistor Q21 and the second transistor Q22.

In the second mode, a negative ESD pulse is provided to the terminal of the first voltage VDD. When a potential value between the input/output terminal and the terminal of the first voltage VDD is equal to or higher than a reference value by a negative ESD pulse, the third transistor Q23 is turned on and the second transistor Q22 is turned on. A discharge path is formed between the input/output terminal and the terminal of the first voltage VDD by the forward feedback operation of the second transistor Q22 and the third transistor Q23.

In the third mode, a positive ESD pulse is provided to the terminal of the second voltage VSS. When a potential value between the terminal of the second voltage VSS and the input/output terminal is equal to or higher than a reference value by a positive ESD pulse, the sixth transistor Q26 is turned on and the fifth transistor Q25 is turned on. A discharge path is formed between the terminal of the second voltage VSS and the input/output terminal by the forward feedback operation of the fifth transistor Q25 and the sixth transistor Q26.

In the fourth mode, a negative ESD pulse is provided to the terminal of the second voltage VSS. When a potential value between the input/output terminal and the terminal of the second voltage VSS is equal to or higher than a reference value by a negative ESD pulse, the fourth transistor Q24 is turned on and the fifth transistor Q25 is turned on. A discharge path is formed between the input/output terminal and the terminal of the second voltage VSS by the forward feedback operation of the fourth transistor Q24 and the fifth transistor Q25.

Figure 8:
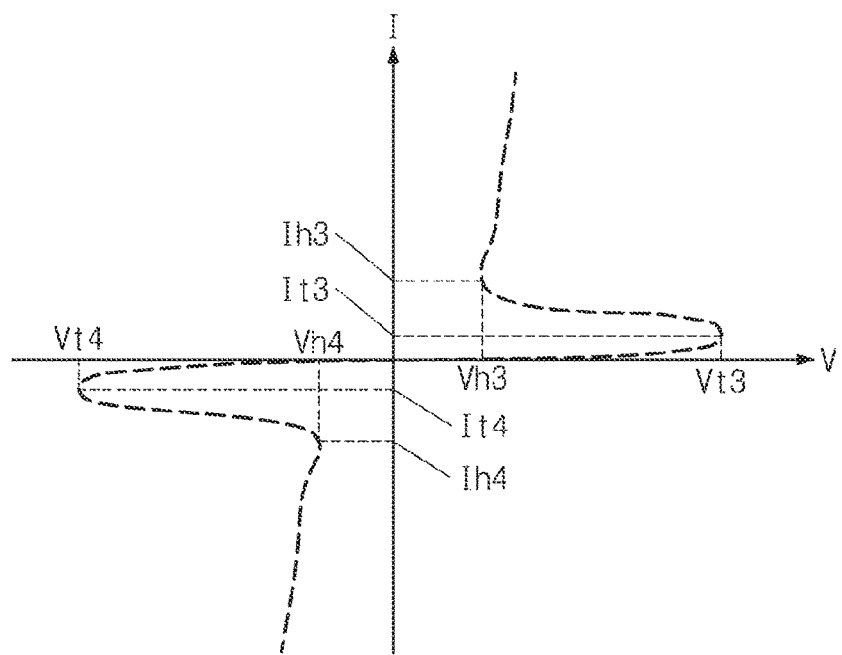
FIG. 8 is a graph illustrating the V-I characteristics of the ESD protection diode of FIG. 5.

FIG. 8 is a graph illustrating the V-I characteristics of the ESD protection diode of FIG. 5. Referring to FIGS. 5 and 8, a potential difference between the terminal of the first voltage VDD and the input/output terminal of the ESD protection diode 200 of FIG. 5 is defined as a horizontal axis, and a current flowing between the terminal of the first voltage VDD and the input/output terminal of the ESD protection diode 200 is defined as a vertical axis. Alternatively, a potential difference between the terminal of the second voltage VSS and the input/output terminal of the ESD protection diode 200 is defined as a horizontal axis, and a current flowing between the terminal of the second voltage VSS and the input/output terminal of the ESD protection diode 200 is defined as a vertical axis.

The graph of FIG. 8 has a graph shape similar to that of FIG. 4. However, compared to FIG. 4, the third holding voltage Vh3 is increased greater than the first holding voltage Vh1, and the fourth holding voltage Vh4 is decreased less than the second holding voltage Vh2.

For example, in the first mode, an avalanche breakdown occurs between the first well 202 and the fourth well 203, and the emitter-base junction of the first transistor Q21 due to the generated electron becomes in a forward bias state. In this case, the first transistor Q21 is turned on and the current gain of the first transistor Q21 is relatively reduced by the first N+ diffusion region 209 formed in the first well 202. The first N+ diffusion region 209 attracts a current flowing through the first transistor Q21. The first well 202, the fourth well 303, and the third well 204 form a second transistor Q21. In the same manner, a current flowing through the first transistor Q21 flows from the first well 202 to the fourth well 203 to turn on the second transistor Q22, and the current gain of the second transistor Q22 is relatively decreased by the 1 P+ diffusion region 210 formed in the fourth well 203. That is, since the first P+ diffusion region 210 attracts electrons moving through the second transistor Q22, the current gain of the second transistor Q22 decreases.

The positive feedback operations of the first transistor Q21 and the second transistor Q22 form a discharge path and in order to maintain the state in such a latch mode, the following equation should be satisfied.

$$\beta_{npn} \cdot \beta_{pnp} \geq 1 \quad \text{[Equation]}$$

$\beta_{npn}$ and $\beta_{pnp}$ correspond to the current gains of the second transistor Q22 and the first transistor Q21, respectively. Due to the decrease of the current gain, the third holding voltage Vh3 for maintaining the state is increased greater than the first holding voltage Vh1. In the same manner, the fourth holding voltage Vh4 is decreased greater than the second holding voltage Vh2 due to the reduction of the current gain in the second mode.

In the third mode, an avalanche breakdown occurs between the second well 206 and the fifth well 205, and the emitter-base junction of the sixth transistor Q26 due to the generated electron becomes in a forward bias state. In this case, the sixth transistor Q26 is turned on and the current gain of the sixth transistor Q26 is relatively reduced by the second N+ diffusion region 215 formed in the second well 206. The reason that the current gain of the sixth transistor Q26 decreases corresponds to the reason that the current gain of the first transistor Q21 decreases. In the same manner, a current flowing through the sixth transistor Q26 flows to the fifth well 205 to turn on the fifth transistor Q25, and the current gain of the fifth transistor Q25 is relatively decreased by the second P+ diffusion region 214 formed in the fifth well 205. The reason that the current gain of the fifth transistor Q25 decreases corresponds to the reason that the current gain of the second transistor Q22 decreases. Due to the decrease of the current gain, the third holding voltage Vh3 is increased greater than the first holding voltage Vh1. In the same manner, the fourth holding voltage Vh4 is decreased greater than the second holding voltage Vh2 due to the reduction of the current gain in the fourth mode.

The ESD protection element 200 may improve the problem that the ESD protection diode 200 operates even after electrostatic discharge by increasing the holding voltage based on the first mode. Therefore, the ESD protection diode 200 according to an embodiment of the inventive concept may be applied to an electronic device requiring a high voltage.

Figure 9:
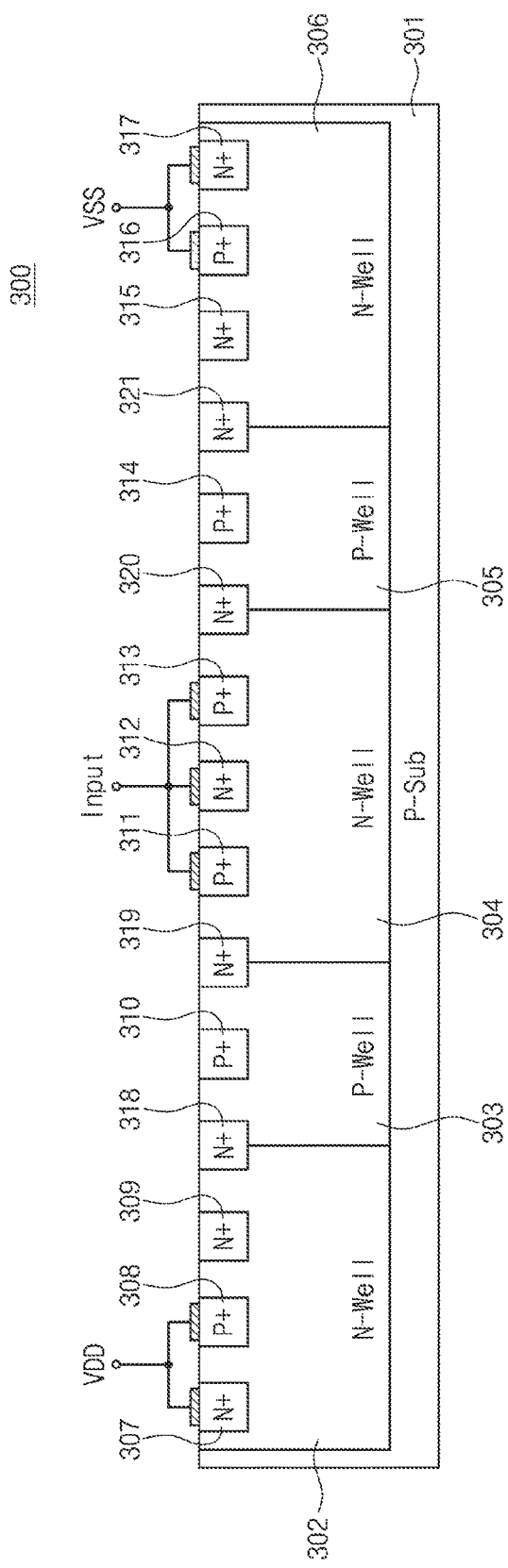
FIG. 9 is a cross-sectional view of an ESD protection diode according to another embodiment of the inventive concept.

FIG. 9 is a cross-sectional view of an ESD protection diode according to another embodiment of the inventive concept.

Referring to FIG. 9, an ESD protection device 300 includes a base substrate 301, a first well 302, a second well 306, a third well 304, a fourth well 303, and a fifth well 305. The components are substantially the same as those of the ESD protection diode 200 of FIG. 5, and therefore, a detailed description thereof will be omitted.

The ESD protection diode 300 further includes a first diffusion region 318, a second diffusion region 321, a third diffusion region 319, and a fourth diffusion region 320. The first diffusion region 318 may be formed in the junction region of the first well 302 and the fourth well 303 to induce a low trigger voltage. The second diffusion region 321 may be formed in the junction region of the second well 306 and the fifth well 305 to induce a low trigger voltage. The third diffusion region 319 may be formed in the junction region of the third well 304 and the fourth well 303 to induce a low trigger voltage. The fourth diffusion region 320 may be formed in the junction region of the third well 304 and the fifth well 305 to induce a low trigger voltage.

Although it is shown that the first diffusion region 318, the second diffusion region 321, the third diffusion region 319, and the fourth diffusion region 320 are N+, the inventive concept is not limited thereto, and the first diffusion region 318, the second diffusion region 321, the third diffusion region 319, and the fourth diffusion region 320 may be P+. Alternatively, the first diffusion region 318 and the second diffusion region 321 may be N+ (or P+), and the third diffusion region 319 and the fourth diffusion region 320 may be P+ (or N+).

The ESD protection diode 300 may induce a low trigger voltage to secure the reliability and stability of an electronic device.

An ESD protection diode and an electronic device including the same according to an embodiment of the inventive concept may increase a holding voltage so as to be applicable to a high voltage integrated circuit. Additionally, an ESD protection diode and an electronic device including the same according to an embodiment of the inventive concept may be configured to have a plurality of discharge paths so as to protect an internal circuit from an ESD pulse applied to a plurality of terminals.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An Electrostatic Discharge (ESD) protection diode comprising:
   a base substrate;
   a first well disposed on the base substrate and connected to a first voltage terminal;
   a second well disposed on the base substrate and connected to a second voltage terminal;
   a third well disposed on the base substrate and connected to an input/output terminal;
   a fourth well disposed between the first well and the third well; and
   a fifth well disposed between the second well and the third well,
   wherein the first well comprises a first N+ diffusion region formed spaced apart from the first voltage terminal,
   the second well comprises a second N+ diffusion region formed spaced part from the second voltage terminal,
   the fourth well comprises a first P+ diffusion region,
   the fifth well comprises a second P+ diffusion region,
   the first well, the second well, and the third well are N-type wells and the fourth well and the fifth well are P-type wells,
   the first well further comprises a third N+ diffusion region and a third P+ diffusion region which are formed to be connected to the first voltage terminal,
   the second well further comprises a fourth N+ diffusion region and a fourth P+ diffusion region, which are formed to be connected to the second voltage terminal, and
   the third P+ diffusion region is formed between the first N+ diffusion region and the third N+ diffusion region and the fourth P+ diffusion region is formed between the second N+ diffusion region and the fourth P+ diffusion region.

2. The ESD protection diode of claim 1, wherein the third well comprises a fifth N+ diffusion region, a fifth P+ diffusion region, and a sixth P+ diffusion region, which are formed to be connected to the input/output terminal; and
the fifth N+ diffusion region is formed between the fifth P+ diffusion region and the sixth P+ diffusion region.

3. The ESD protection diode of claim 2, wherein the third P+ diffusion region, the first well, and the fourth well form a first transistor;
the first well, the fourth well, and the third well form a second transistor;
the fifth P+ diffusion region, the third well, and the fourth well form a third transistor;
the sixth P+ diffusion region, the third well, and the fifth well form a fourth transistor;
the third well, the fifth well, and the second well form a fifth transistor;
the fourth P+ diffusion region, the second well, and the fifth well form a sixth transistor;
the first transistor, the third transistor, the fourth transistor, and the sixth transistor are PNP bipolar transistors; and
the second transistor and the fifth transistor are NPN bipolar transistors.

4. The ESD protection diode of claim 3, wherein when a voltage level of the first voltage terminal is higher than a voltage level of the input/output terminal by more than a first reference value, the first transistor and the second transistor are turned on;
when the voltage level of the input/output terminal is higher than the voltage level of the first voltage terminal by more than a second reference value, the second transistor and the third transistor are turned on;
when the voltage level of the input/output terminal is higher than a voltage level of the second voltage terminal by more than a third reference value, the fourth transistor and the fifth transistor are turned on; and
when the voltage level of the second voltage terminal is higher than the voltage level of the input/output terminal by more than a fourth reference value, the second transistor and the third transistor are turned on.

5. The ESD protection diode of claim 4, wherein the first reference value and the fourth reference value are the same, and the second reference value and the third reference value are the same.

6. The ESD protection diode of claim 1, further comprising:
a first diffusion region formed in a junction region of the first well and the fourth well; and
a second diffusion region formed in a junction region of the second well and the fifth well.

7. The ESD protection diode of claim 6, further comprising:
a third diffusion region formed in a junction region of the third well and the fourth well; and
a fourth diffusion region formed in a junction region of the third well and the fifth well.

8. An electronic device comprising:
a first voltage terminal configured to receive a power supply voltage;
an input/output terminal configured to receive an input voltage;
a second voltage terminal grounded; and
an Electrostatic Discharge (ESD) protection diode configured to form a discharge path when an ESD pulse is received from the first voltage terminal, the input/output terminal, and the second voltage terminal,
wherein the ESD protection diode forms a first discharge path from the first voltage terminal to the input/output terminal when a voltage level of the first voltage terminal is higher than a voltage level of the input/output terminal by more than a first reference value,
wherein the ESD protection diode forms a second discharge path from the input/output terminal to the first voltage terminal when the voltage level of the input/output terminal is higher than the voltage level of the first voltage terminal by more than a second reference value,
wherein the ESD protection diode forms a third discharge path from the input/output terminal to the second voltage terminal when the voltage level of the input/output terminal is higher a voltage level of the second voltage terminal by more than a third reference value,
wherein the ESD protection diode forms a fourth discharge path from the second voltage terminal to the input/output terminal when the voltage level of the second voltage terminal is higher than the voltage level of the input/output terminal by more than a fourth reference value,
wherein the ESD protection diode includes:
a base substrate;
a first well disposed on the base substrate and connected to the first voltage terminal;
a second well disposed on the base substrate and connected to the second voltage terminal;
a third well disposed on the base substrate and connected to the input/output terminal;
a fourth well disposed between the first well and the third well; and
a fifth well disposed between the second well and the third well,
wherein the first well comprises a first N+ diffusion region formed spaced apart from the first voltage terminal,
the second well comprises a second N+ diffusion region formed spaced part from the second voltage terminal,
the fourth well comprises a first P+ diffusion region,
the fifth well comprises a second P+ diffusion region,
the first well, the second well, and the third well are N-type wells and the fourth well and the fifth well are P-type wells,
the first well further comprises a third N+ diffusion region and a third P+ diffusion region which are formed to be connected to the first voltage terminal,
the second well further comprises a fourth N+ diffusion region and a fourth P+ diffusion region, which are formed to be connected to the second voltage terminal, and
the third P+ diffusion region is formed between the first N+ diffusion region and the third N+ diffusion region and the fourth P+ diffusion region is formed between the second N+ diffusion region and the fourth P+ diffusion region.

9. The electronic device of claim 8, wherein the ESD protection diode comprises:
a first transistor having one end connected to the first voltage terminal;
a second transistor having one end connected to the first voltage terminal and the other end connected to the input/output terminal;

a third transistor having one end connected to the input/output terminal;

a fourth transistor having one end connected to the input/output terminal;

a fifth transistor having one end connected to the input/output terminal and the other end connected to the second voltage terminal; and a sixth transistor having one end connected to the second voltage terminal, wherein a control terminal of the second transistor is connected to the other end of the first transistor and the other end of the third transistor; and a control terminal of the fifth transistor is connected to the other end of the fourth transistor and the other end of the sixth transistor.

10. The electronic device of claim 9, wherein the ESD protection diode comprises:

a first resistor connected between the control terminal of the first transistor and the first voltage terminal;

a second resistor connected between the control terminal of the third transistor and the input/output terminal;

a third resistor connected between the control terminal of the fourth transistor and the input/output terminal; and a fourth resistor connected between the control terminal of the sixth transistor and the second voltage terminal.

11. The electronic device of claim 9, wherein the first discharge path is formed as the first and second transistors are turned on;

the second discharge path is formed as the second and third transistors are turned on;

the third discharge path is formed as the fourth and fifth transistors are turned on; and the fourth discharge path is formed as the fifth and sixth transistors are turned on.

12. The electronic device of claim 8, further comprising an inverter unit configured to receive an input voltage from the input/output terminal to generate an output voltage, wherein the inverter unit comprises:

a PMOS configured to output the power supply voltage when the input voltage is in a low level; and an NMOS configured to output a ground voltage when the input voltage is in a high level.

* * * * *